(12) United States Patent
LaPlante et al.

(10) Patent No.: US 6,223,636 B1
(45) Date of Patent: May 1, 2001

(54) LOW-COST HIGH-DENSITY GANG PUNCH

(75) Inventors: Mark J. LaPlante; James G. Balz, both of Walden; Ferdinand D. DiMaria, Wappingers Falls; John U. Knickerbocker, Hopewell Junction; David C. Long, Wappingers Falls; Thomas Weiss, Poughquag; Robert P. Westerfield, Jr., Montgomery, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/128,448

(22) Filed: Aug. 3, 1998

(51) Int. Cl.$^7$ .................................................. B26F 1/04
(52) U.S. Cl. .................................. 83/13; 83/619; 83/549; 83/687; 83/929.1
(58) Field of Search .............................. 83/549, 550, 619, 83/618, 687, 691, 698.51, 929.1, 13, 563, 565, 571, 639.1; 234/44, 92, 93, 79, 80, 131, 77, 78, 94, 111, 116

(56) References Cited

U.S. PATENT DOCUMENTS

| | | | |
|---|---|---|---|
| 3,750,502 | * | 8/1973 | Ball ........................................ 83/687 |
| 4,123,956 | | 11/1978 | Harvey . |
| 4,390,771 | | 6/1983 | Kurtz . |
| 4,425,829 | | 1/1984 | Kranik et al. . |
| 4,480,782 | * | 11/1984 | Morishima .............................. 83/571 |
| 4,558,619 | | 12/1985 | Caumont . |
| 4,596,359 | * | 6/1986 | Nordi ................................... 234/107 |
| 4,674,372 | | 6/1987 | Mobley . |
| 4,817,477 | * | 4/1989 | Emery et al. ............................ 83/23 |
| 4,872,101 | | 10/1989 | Stroms . |
| 5,024,127 | | 6/1991 | Mueller et al. . |
| 5,090,284 | | 2/1992 | Nakajima . |
| 5,136,905 | | 8/1992 | Stack et al. . |
| 5,205,149 | * | 4/1993 | Hayashi ................................. 83/552 |
| 5,233,895 | | 8/1993 | Coneski et al. . |

(List continued on next page.)

OTHER PUBLICATIONS

"Punch Programming Mechanism", A.F. Coneski, et al., IBM Technical Disclosure Bulletin, vol. 26, No. 10A, Mar. 1984.

"Gang Punch For Soft Workpieces", E.S. Pearson, IBM Technical Disclosure Bulletin, vol. 19, No. 4, Sep. 1976.

"'Air Spring' Programmable Via Punching Head", J.R. Kranik and W.F. Mueller, IBM Technical Disclosure Bulletin, vol. 16, No. 12, May 1974.

"Progressive Gang Punch", J.R. Kranik and B.C. O'Neill, IBM Technical Disclosure Bulletin, vol. 15, No. 2, Jul. 1972.

*Primary Examiner*—Rinaldi I. Rada
*Assistant Examiner*—Kim Ngoc Tran
(74) *Attorney, Agent, or Firm*—DeLio & Peterson, LLC; John J. Tomaszewski; Tiffany L. Townsend (57) ABSTRACT

A gang-punch pin apparatus for punching selected hole patterns in thin sheet materials such as greensheets is provided. The gang-punch pin apparatus uses program plates in the punch apparatus which plates are positioned intermediate the non-punching end of the punch pins and a clearance plate wherein punch pins not used for punching a particular layer of the MLC are retracted into during punching. At the other punch pin locations, the punch pins, upon activation of the punch apparatus by compressing an expandable chamber, usually by application of a force on the punch apparatus, are extended through the lower portion of the punch apparatus to form vias in a greensheet. A die apparatus is also provided for use with the punch assembly to form the vias and to remove the punched material (slugs) from the die apparatus. The gang punch-pin may be shorter than conventional pins and be made at a low cost because of the thin sheet metal plates preferably used to make the component parts of the punch and die apparatus.

11 Claims, 8 Drawing Sheets

U.S. PATENT DOCUMENTS

| | | | |
|---|---|---|---|
| 5,295,938 | * 3/1994 | Jilsen | 83/698.91 |
| 5,431,329 | 7/1995 | Hasegawa et al. . | |
| 5,740,712 | * 4/1998 | Watkins et al. | 83/549 |
| 5,979,277 | * 11/1999 | Kitsuda et al. | 83/13 |
| 6,006,636 | * 12/1999 | Baldwin et al. | 83/687 |

* cited by examiner

LOW-COST HIGH-DENSITY GANG PUNCH

CROSS-REFERENCE TO RELATED APPLICATIONS

Aspects of the present invention are related to subject matter disclosed in co-pending applications entitled Apparatus and Method for Producing Punch Pin with Spherical Head and Gang Punch Tool Assembly both co-pending applications filed on even date herewith and both assigned to the same assignee as the present invention.

BACKGROUND OF THE INVENTION

1. Field of the Invention

This invention relates to a punch apparatus and method for punching holes in thin sheet material and, more particularly, to a method and gang-punch apparatus containing a plurality of punches in a fixed pattern and which apparatus is programmable to activate certain punches to form holes in a desired hole pattern in the thin sheet material, such as a greensheet.

2. Description of Related Art

In the manufacture of multilayer ceramic (MLC) substrates for integrated circuit semiconductor package structures, a plurality of green ceramic sheets (commonly termed greensheets) are formed by doctor blading a slurry containing a resin binder, a particulate ceramic material, solvents and a plasticizer, drying the doctor bladed sheet and cutting it into appropriate size sheets. Through-holes, commonly termed vias, are then punched in the greensheets to facilitate forming electrical interconnections through the sheet. Electrically conductive paste is deposited in the holes and in appropriate patterns on the surface of the greensheets, the sheets stacked and laminated, and the assembly subsequently fired at a sintering temperature.

The formation of the vias in the ceramic material is accomplished in its green state. Prior to being fired, the greensheets are easily deformed and the precision with which the via holes are formed is greatly dependent upon the use of an apparatus which minimizes distortion or disruption to the structural integrity of the greensheet other than forming the via hole. With the size of electrical components constantly being reduced through technical improvement, the positioning of the vias in ceramic greensheets is becoming ever more restrictive. Further, with the increase in the quantity of the electronic circuits that may be positioned and packaged on a small area of the ceramic substrate, a requirement for a larger number of via holes in the greensheet is evident.

Large numbers of holes must be punched into a greensheet with a high degree of precision in order to properly position the holes. At the same time, this punching operation must occur very rapidly in order to produce the large numbers of greensheets that are necessary in the mass production of electronic components.

A significant portion of the costs associated in manufacturing ceramic packages can be attributed to punching vias in greensheets. A number of factors play a major role in accounting for these costs such as: 1) the high cost for punch die sets customized to a specific product; 2) the long lead-time associated with punch die set fabrication precludes early introduction of a new product; 3) non-customized automated punch die sets have very low through put for a non-grid product; and 4) automated punch/die sets punches step repeat numerous times to punch a single sheet resulting in low throughput.

One method for punching greensheets is using a gang-punching apparatus. A gang-punch is a punch/die set where all the punches for a particular ceramic greensheet layer are rigidly and permanently mounted in a fixed plate. The gang-punch is used to punch the entire sheet (layer) with a single stroke. A gang-punch has very high throughput and is cost effective for very high volume products.

Unfortunately, the use of a gang-punch apparatus has drawbacks since the fabrication of dedicated gang-punches with fixed patterns of via holes are not practical for engineering changes (E.C.'s) or multiple patterns because the same apparatus cannot be easily modified to form different via hole patterns in ceramic greensheets having a different via pattern thereby requiring separate gang-punch apparatus for each E.C. or pattern desired. Additionally, the turn-around time for a new gang-punch/die set is lengthy and high via density is unattainable with single punch heads and usually require multiple punch heads with staggered punches to punch tight grids. The cost is also prohibitive for the punches since for a typical pattern (up) that is specified nine (9) times on each greensheet (9-up) and with each pattern having 2000 (or more) vias, such a 9-up layer would require a gang punch apparatus with a total of 18,000 punches. For a multilayer ceramic substrate composed of ten (10) layers, with each layer requiring a separate gang punch apparatus with 18,000 punches, 180,000 punches would be required to populate these apparatus. At a typical cost of $1 per punch, it would cost $180,000 for the punches alone. Current technology limits for single stroke gang-punching is a minimum punch spacing of about 16 mils.

A number of attempts have been made to provide a gang-punch apparatus which will economically and efficiently provide the means to make via openings in greensheets. One type apparatus utilizes an interposer mask which contains hole openings where holes are desired to be punched. In these apparatus, a plurality of punch elements arranged in a grid are positioned over the greensheet which is covered by the interposer mask. When the punch elements contact the interposer mask as the punch heads are moved downwardly, the holes will be punched where the openings occur since the punch element would pass through the openings in the interposer mask and through the ceramic greensheet. In other areas covered by the interposer mask, i.e., where holes are not desired, the interposer mask will cause the punch element to be retracted into the punch head. Such apparatus are shown in IBM Technical Disclosure Bulletins, Vol. 16, No. 12, May 1974; Vol. 19, No. 4, September 1976 and Vol. 26, No. 10A, March 1984. Other punch apparatus are shown in U.S. Pat. Nos. 4,872,381; 4,425,829; 5,024,127; 5,090,284; and 5,233,895. In U.S. Pat. No. 4,872,381, supra, for example, a programmable magnetic repulsion punching apparatus is shown. A progressive gang-punch is shown in IBM Technical Disclosure Bulletin Vol. 15, No. 2, July 1972 wherein a gang-punch is shown utilizing steel balls on the surface of the punch head at locations of punches to be punched which when a roller traverse the top of the punch head only vias are punched where steel balls are located. The disclosures of the above references and patents are hereby incorporated by reference.

Bearing in mind the problems and deficiencies of the prior art, it is therefore an object of the present invention to provide a programmable gang-punch apparatus for punching selected hole patterns in thin sheet material such as greensheets.

It is an additional object of the invention to provide a programmable gang-punch apparatus which may be fabricated using laser or photoetch techniques.

It is further object of the present invention to provide a method for punching via holes in greensheets using the gang-punch pin apparatus of the invention.

It is another object of the invention to provide greensheets and other substrates punched with through holes using the apparatus and method of the invention.

Other objects and advantages of the present invention will be readily apparent from the following description.

SUMMARY OF THE INVENTION

The above and other objects and advantages, which will be apparent to one of skill in the art, are achieved in the present invention which is directed to, in a first aspect, a programmable gang-punch apparatus using punch pins for punching selected hole patterns in thin sheet material such as a greensheet wherein, depending on the hole pattern to be punched, some of the punch pins are used for punching and the remaining punch pins are non-punching, the apparatus broadly stated comprising a pair of opposed plates containing vertical through-holes forming an expandable/contractible chamber, e.g., a pressure chamber and in which punch pins having an enlarged upper end are positioned, a program plate overlying the upper opposed plate containing a plurality of vertical through-holes for punch pins where punching is not desired, a clearance plate overlying the program plate having vertical through-holes in all punch pin locations and into which holes punch pins not punching during punching are retracted and preferably an overlying pusher plate to exert a force on the apparatus for punching.

In another aspect of the invention, a preferred gang-punch apparatus comprises:

a lower stripper plate formed with a plurality of vertical through-holes;

a guide plate formed with a plurality of corresponding vertical through-holes;

a pressure chamber or other expandable/contracting means between the guide and lower stripper plates, the plates when the chamber is not compressed being in an extended non-punching position and, when compressed, the plates being in a contracted punching position;

a plurality of elongated punch pins axially slideably disposed in the vertical through-holes of the guide and stripper plates with the upper ends of the pins being larger so that the pins rest on the guide plate shoulder, the pins being of a length when the guide and stripper plates are in a contracted punching position, the lower ends of the pins extend below the lower surface of the lower stripper plate and through a thin sheet material being punched and die;

a program plate disposed on the upper surface of the guide plate formed with a plurality of vertical through-holes overlying non-punching punch pins;

a clearance plate disposed on the upper surface of the program plate formed with a plurality of vertical through-holes corresponding to the vertical through-holes of the guide and stripper plates, the clearance plate being of a thickness sufficient to contain in the through-holes the non-punching punch pins when the guide and stripper plates are in a contracted punching position; and means to exert a force on the clearance plate to force the guide and stripper plates together thereby extending the punching punch pins below the lower surface of the stripper plate and forming a hole pattern in the thin sheet material with the non-punching punch pins extending into the vertical through-holes of the clearance plate so that there is no punching of the thin sheet material at the non-punching punch pin locations.

It is a preferred feature of the invention that a pressure chamber be used between the guide and stripper plates to enable the plates to be in an extended non-punching position or contracted punching position. The chamber may be expanded with the application of air or other pressure within the chamber. The apparatus in the non-punching position will have air or other gas within the chamber under pressure so that the punch pins are disposed within the guide and stripper plates. When the apparatus is to be used, the air pressure within the chamber will be vented or reduced so that a force exerted on the pusher plate will force the guide plate toward the stripper plate extending the desired punch pins below the lower surface of the stripper plate and the non-punch pins into the through-holes of the clearance plate. After the punching operation, air will be forced into the chamber, extending the chamber and, once again, positioning all the punch pins within the guide and stripper plates.

In another aspect of the invention, a head plate having corresponding vertical through-holes is used intermediate the guide plate and the program plate to form the shoulder on the guide plate to secure the punch pins in the guide and stripper plates.

It is an additional aspect of the invention to provide a die apparatus for use with the programmable gang-punch apparatus for punching selected hole patterns in thin sheet material. The die apparatus comprises:

a die plate formed with vertical through-holes corresponding to the vertical through-holes of the guide and stripper plates;

a window plate on which the die plate is disposed, the window plate comprising a plurality of vertical through-holes each through-hole corresponding to at least one of the vertical through-holes of the die plate and larger than the vertical through-holes of the die plate to support the die plate and to facilitate punched material removal after punching; and a groove plate on which the window plate is disposed, the groove plate having a plurality of channels preferably less than the number of vertical through-holes in the window plate and connected to a vacuum or pressure source to remove punched material from the die apparatus. Additionally, the groove plate provides support for the window plate, preventing the window and die plates from bending under the load imposed on them by the punching forces.

In an additional aspect of the invention, a method of gang-punching selective hole patterns in thin sheet material comprises the steps of:

providing a gang-punch pin apparatus and die apparatus as described above;

positioning the punch apparatus on top of a greensheet which is disposed on top of the die apparatus;

exerting a force on the punch apparatus collapsing the pressure chamber and moving the desired punch pins through the thin sheet material and into the die plate with the non-punching pins retracting into the clearance plate;

removing the punched material from the die apparatus; and removing the force on the punch assembly and expanding the pressure chamber to retract the punch pins from the die plate and greensheet into the guide and stripper plates.

In another preferred aspect of the invention, at least one and preferably all the plates of the punch apparatus and/or die apparatus are made of a thin material which can be fabricated by using lasers or other such hole forming techniques such as photoetching, mechanical drilling and electro-discharge machining. Multiple plates, such as the clearance plates, may be necessary to provide the necessary plate thickness for punch pin retraction clearance. The techniques available for fabricating these thin plates are of a much lower cost than those for thicker plates. Another feature of the invention is that the thin plates enable usage of short punches having a length up to about 0.250 inch, preferably about 0.025 to 0.100 inch. The benefit of short length provides an increase in buckling strength by an amount inversely proportional to the square of the length.

The programmable gang punch apparatus of the invention is preferably used with an assembly as described in a patent application entitled "Gang Punch Tool Assembly" filed on even date herewith and assigned to the assignee of the subject application. Punch pins for use in the apparatus are preferably made as described in a patent application entitled "Apparatus and Method for Providing Punch Pins with Spherical Head" filed on even date herewith and assigned to the assignee of the subject invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–6 of the drawings in which like numerals refer to like features of the invention. Features of the invention are not necessarily shown to scale in the drawings.

Figure 1A:
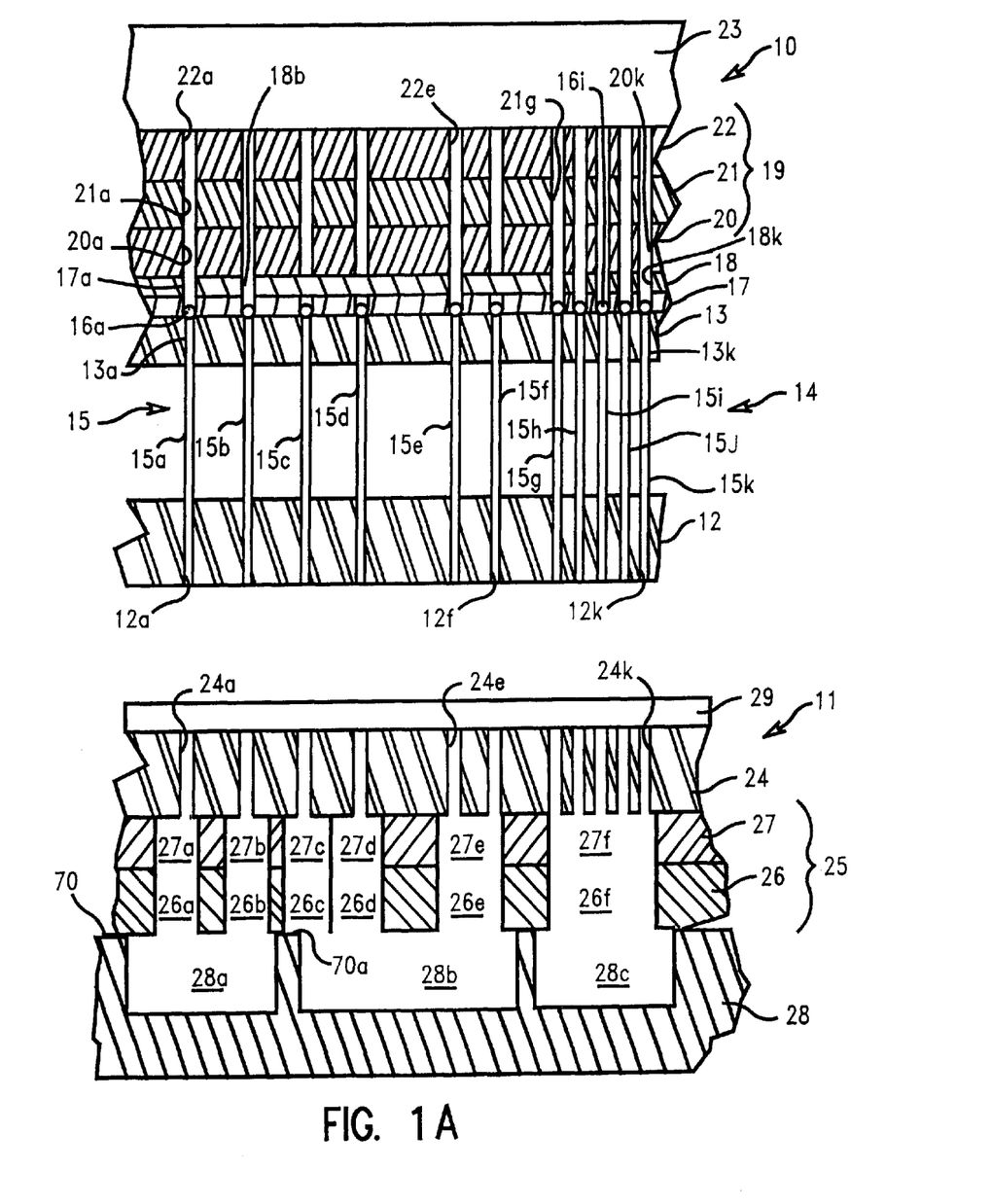
FIGS. 1A–1D shows the gang-punch apparatus and die apparatus of the invention being used in a series of steps to form selected via holes in a greensheet.

Referring now to the figures in detail, the present invention of a method of using the punch apparatus and die apparatus of the invention to make via openings in greensheets can be demonstrated. In FIG. 1A, a gang-punch assembly shown generally as 10 is shown positioned above and apart from die assembly 11 which has a greensheet 29 thereon. As will be shown in the following figures, in operation, gang punch assembly 10 with stripper plate 12 is placed on top of greensheet 29 in registration with the vertical through-holes 24a–24k of die plate 24. The punch assembly will then be activated by exerting a force on the gang-punch assembly and the via holes punched.

Figure 5A:
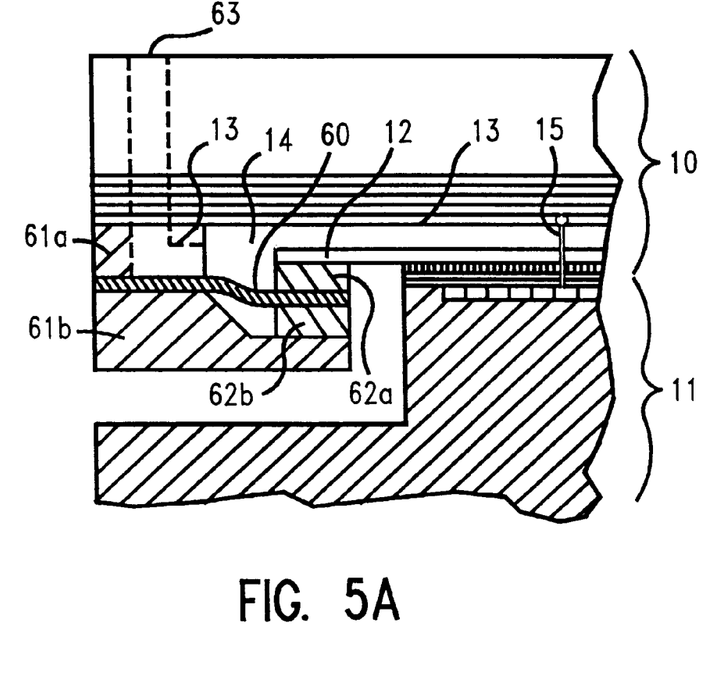
FIGS. 5A and 5B show a pressure chamber of an apparatus of the invention.
Figure 5B:
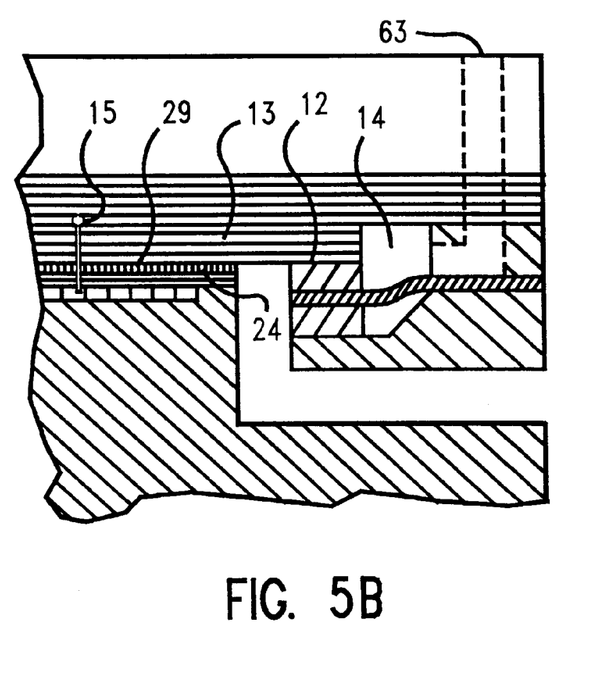

Referring to FIG. 1A, punch assembly 10 comprises a stripper plate 12 having vertical through-hole openings 12a–12k therein. Overlying stripper plate 12 is guide plate 13 having vertical through holes 13a–13k in registration with vertical through-hole openings 12a–12k of stripper plate 12. Between guide plate 13 and stripper plate 12 is a pressure chamber shown generally as 14 bounded by stripper plate 12 and guide plate 13. This chamber 14 as shown in FIGS. 5A and 5B, comprising guide plate 13 above and stripper plate 12 below, allows stripper plate 12 to move up and down with respect to guide plate 13. This is achieved as shown in FIGS. 5A and 5B by enclosing plates 12 and 13 with a surrounding pressure containment assembly consisting of outer rings 61a and 61b, rigidly fixed to guide plate 13, and moveable inner rings 62a and 62b rigidly attached to stripper plate 12. A flexible rubber diaphragm 60 allows inner rings 62a and 62b to move in relation to outer rings 61a and 61b while maintaining pressure within the pressure chamber 14. Pressure in pressure chamber 14 can be controlled by utilizing gas ports 63. FIG. 5A shows the pressure chamber 14 in an expanded, non-punching portion with low pressure (10 psi) applied through ports 63. FIG. 5B shows the pressurized chamber 14 in a contracted, punching position. At this point after punching, high gas pressure can be applied through ports 63 to the pressure chamber 14, to apply a holding force to the stripper plate 12, firmly holding the greensheet 29 against the die plate 24 while retracting (stripping) the punch pins from the die assembly 11 and greensheet 29.

Following this stripping operation, high pressure is exhausted and low pressure is again applied to the pressurized chamber 14 so that the gang punch assembly 10 may be lifted to gain access for removal of the greensheet 29. This prevents over-extension (bowing) of the stripper plate 12 which may cause the punch pins 15 to be retracted past the upper surface of the stripper plate 12 causing possible damage to the punch pins 15 upon re-entry into the stripper plate 12.

Although a pressure containment ring assembly 61a and 61b and 62a and 62b are shown, alternate methods of sealing pressure chamber 14 can be used. These may consist of O-ring seals or others to prevent the pressurized air from escaping the pressure chamber.

Referring back to FIG. 1A, the punch pins 15a–15k have a spherical head 16a–16k at the upper end of each punch pin with said spherical heads slightly larger than the diameter of the punch pin. The punch pins may be made of any suitable material with tungsten being preferred. A head plate 17 is positioned on the upper surface of guide plate 13 and has a plurality of corresponding vertical through-holes 17a–17k corresponding to the vertical through-holes of guide plate 13. The pins 15a–15k are shown disposed in the guide and stripper plates and the head plate 17. The vertical through openings of head plate 17 are slightly larger than the vertical through-hole openings of stripper plate 12 and guide plate 13 to accommodate the larger punch pin head. The heads 16a–16k of punch pins 15a–15k, therefore, rest on the upper surface of guide plate 13 and are restricted when the punch assembly is at rest from moving downwardly through the guide and stripper plates by the heads 16a–16k of the punch pins.

A program plate 18 is shown on top of head plate 17 and comprises a plurality of vertical through-hole openings 18a, 18b, 18e, 18g, 18h, 18i, 18j and 18k. The size of the vertical through-hole openings are approximately the same size as the vertical through-hole openings of head plate 17 to accommodate movement of the punch pins 15a–15k therethrough. The program plate 18 has openings only where punching of the greensheet is not desired. Where punching of the greensheet is desired as, for example, punch pins 15c, 15d and 15f, there are no vertical through-hole openings in the program plate 18.

On top of program plate 18 is a clearance plate assembly shown generally as 19. The clearance plate assembly comprises a lower clearance plate 20, an intermediate clearance plate 21 and an upper clearance plate 22. A force plate 23 is disposed on top of upper clearance plate 22. Each clearance plate has vertical through-hole openings therein corresponding to the vertical through-hole openings of stripper plate 12, guide plate 13 and head plate 17. Thus, clearance plate 20 has vertical through openings 20a–20k, clearance plate 21 has vertical through-hole openings 21a–21k and upper clearance plate 22 has vertical through-hole openings 22a–22k. As will be more fully described hereinbelow, for punch pin 15a, which is a non-punching pin for the particular greensheet to be punched, during the punching operation, punch pin 15a will be forced upward through vertical through-hole openings 18a, 20a, 21a and 22a. This is to be contrasted with punch pin 15c, which is a punching pin, which during the punching operation will be forced downward through the lower surface of stripper plate 12 forming a via in greensheet 29.

Referring now to the die assembly 11 of FIG. 1A, a groove plate 28 has a series of channels 28a, 28b and 28c extending to an opening (not shown) for removing punched material (commonly termed slugs). Disposed on the surface of groove plate 28 is a window plate assembly shown generally as 25. The window plate assembly 25 comprises a lower window plate 26 and an upper window plate 27. Each window plate has corresponding openings 26a–26f and 27a–27f forming vertical through-hole openings in the window plate. It will be noticed that the diameter of the window plate openings are larger than the via openings 24a–24k of die plate 24. The die plate 24 is disposed on top of the window plate assembly 25 and comprises a series of via openings 24a–24k which correspond to vertical through-hole openings 12a–12k of stripper plate 12. A greensheet 29 is disposed on the top of die plate 24.

Figure 1B:
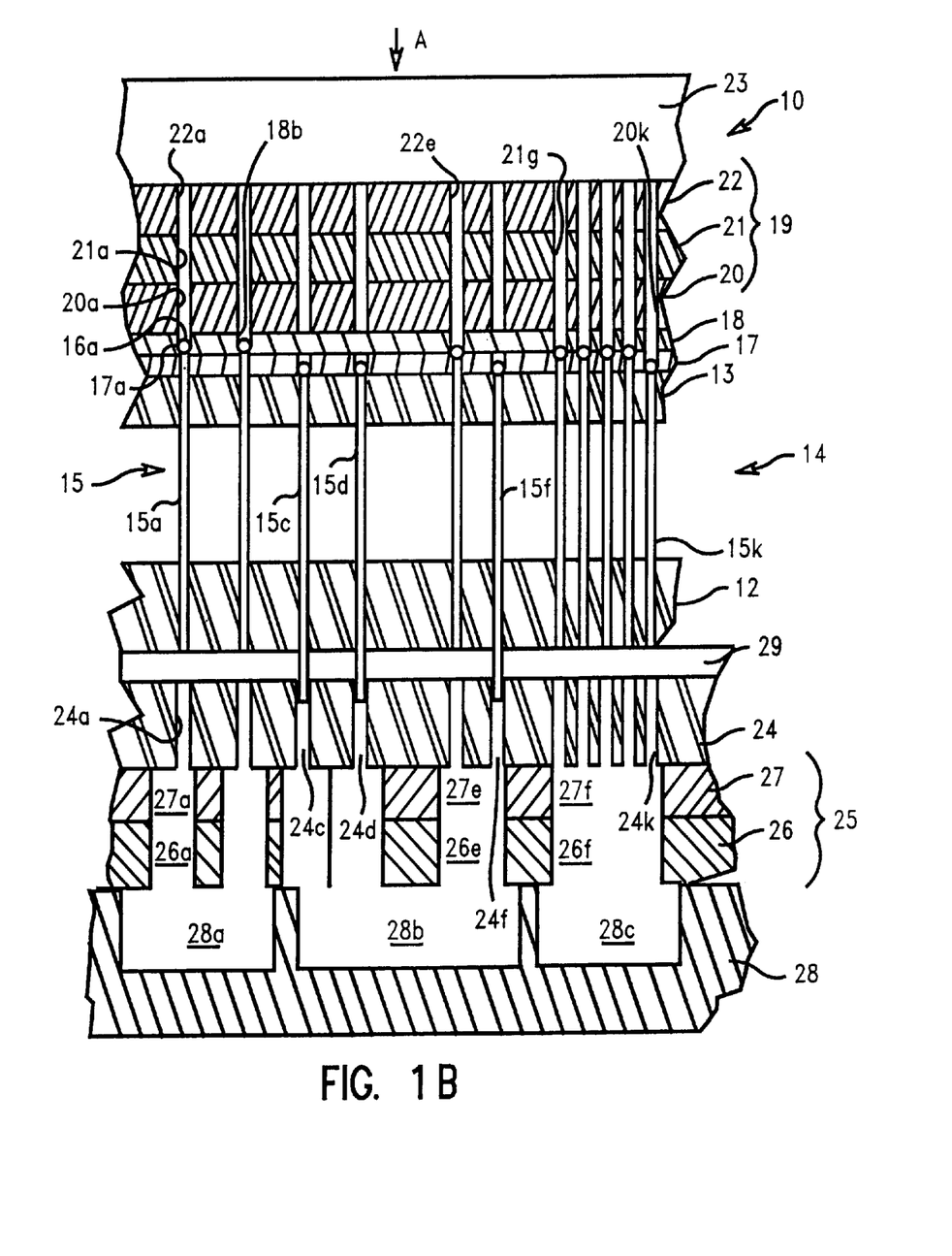

Referring now to FIG. 1B, the punch assembly 10 has been placed on the surface of greensheet 29 and has been activated for the punching operation. Thus, a force as shown by arrow A is applied to force plate 23 to force pressure chamber 14 to contract. The chamber 14 will typically be vented allowing gas in the chamber to be expelled. As chamber 14 contracts, punch pins 15c, 15d and 15f will be forced through the lower surface of stripper plate 12 and into greensheet 29 at corresponding die plate openings 24c, 24d and 24f. The non-punching punch pins 15a, 15b, 15e and 15g–15k are forced upward through the vertical throughholes in the program plate and the clearance plates and do not punch the greensheet.

Figure 1C:
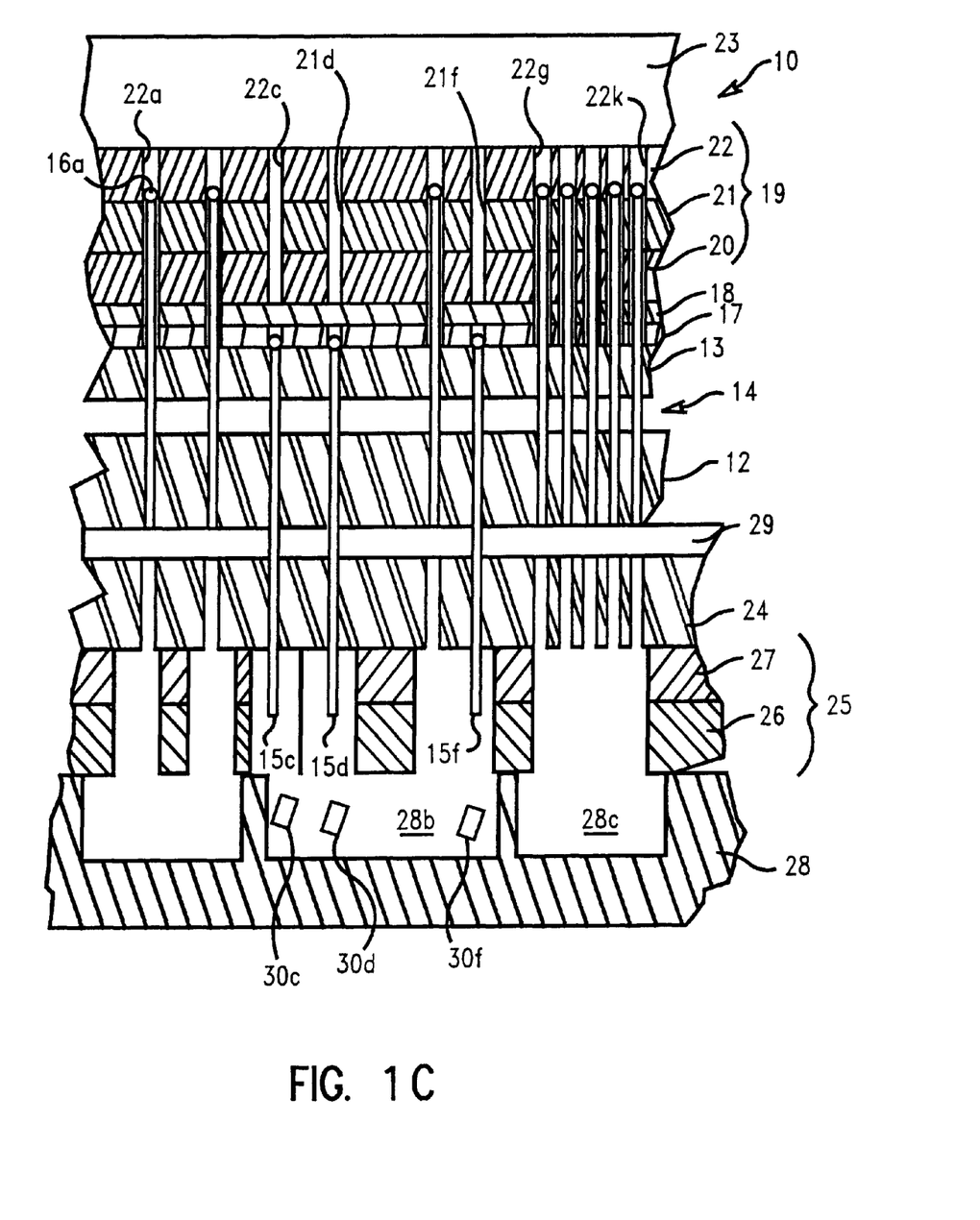
Figure 1D:
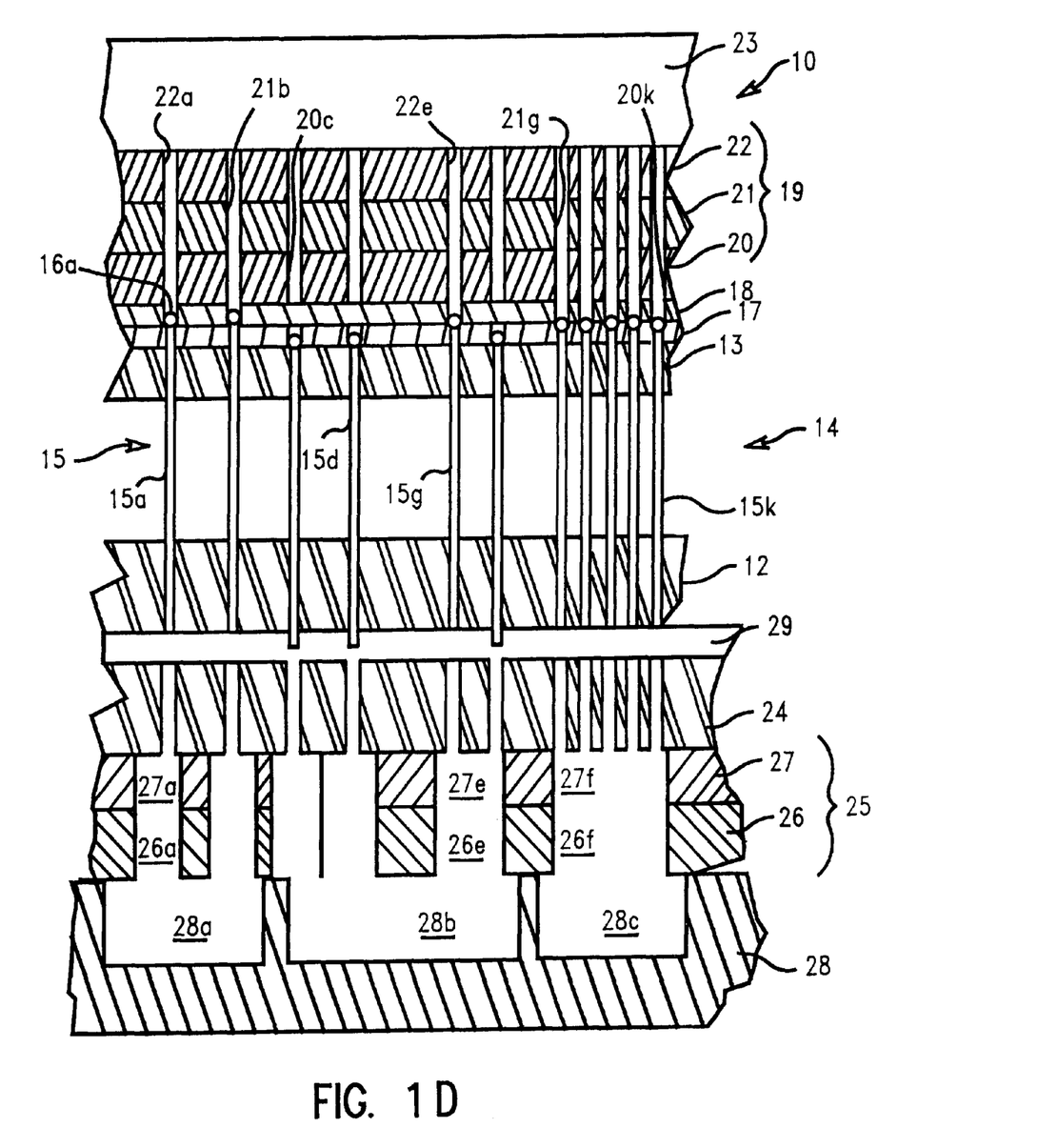
Figure 2A:
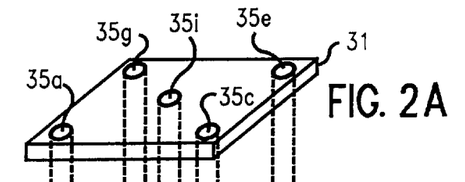
FIGS. 2A–2E show a 4 layer package containing multi-layer ceramic substrate with the required via holes in each layer and a data layer FIG. 2E showing the total number of via holes and positions thereof needed for the gang-punch apparatus.
Figure 2B:
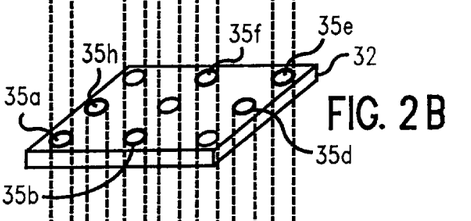
Figure 2C:
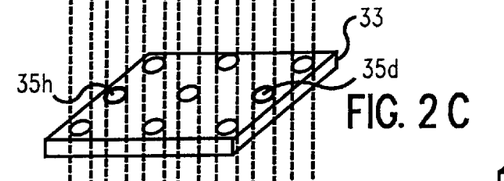
Figure 2D:
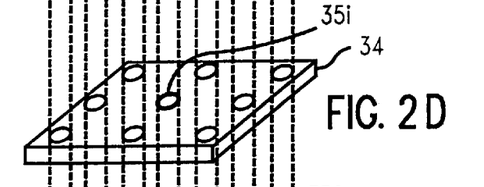
Figure 2E:
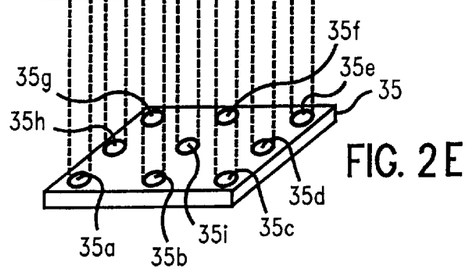
Figure 3A:
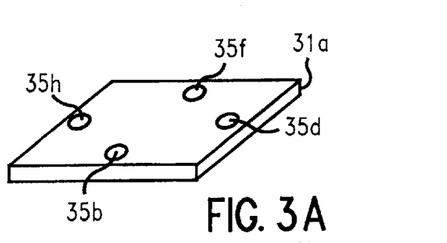
FIGS. 3A–3D show the program plates used to form respective layers of FIGS. 2A–2D using the apparatus of the invention.
Figure 3B:
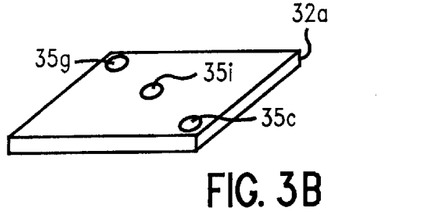
Figure 3C:
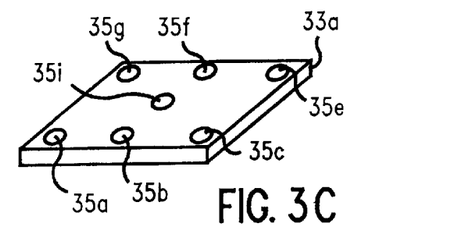
Figure 3D:
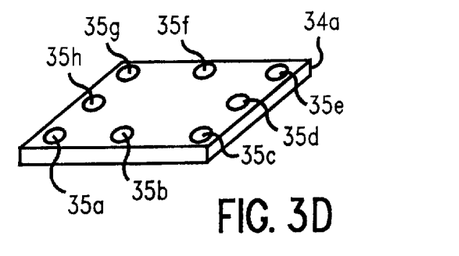

Referring now to FIG. 1C, the punching operation has been completed and the pressure chamber 14 is completely contracted so that the punch pins 15c, 15d and 15f extend completely through the respective die openings and window plate openings forming slugs 30c, 30d and 30f which are shown falling toward the bottom of channel 28b. As shown in FIG. 1D, after the punching operation, high pressure air is supplied to chamber 14 expanding the chamber and retracting guide plate 13 from stripper plate 12 and retracting punch pins 15c, 15d and 15f from the die assembly 11 and greensheet 29. In its final position, the punch pins 15c, 15d and 15f will be completely removed from greensheet 29 and the apparatus ready for the punching of another greensheet. The slugs 30c, 30d and 30f may be removed by vacuum or air pressure in the channel. An important feature of the invention is that pressure chamber 14 acts to maintain lower stripper plate 12 in contact with the greensheet 29 surface thus holding the greensheet firmly in place against the die plate 24 during both punching and stripping to ensure positional accuracy while minimizing tearing or other deformation of the formed via.

Figure 6:
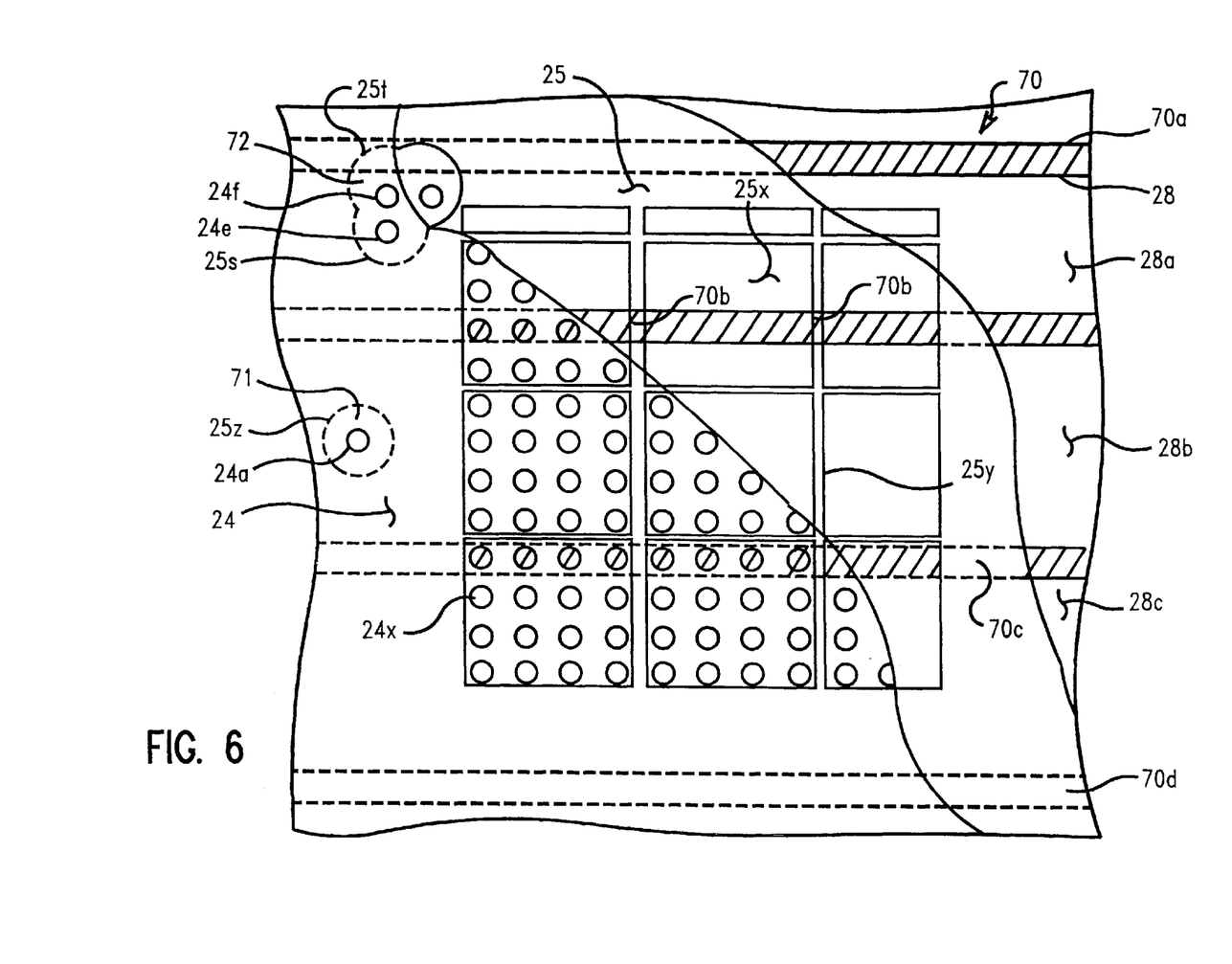
FIG. 6 shows a cut-away plan view of a universal groove plate of a die of the invention.

Another important feature of the current invention is the utilization of a Universal Groove plate. FIG. 6 shows a cut-away plan view of the die portion of the present invention. A portion of a die plate 24 with closely spaced holes 24x depicting a typical punch pin density of 0.0041" diameter on a 0.0081" grid. A cut-away view of the window plate 25 is shown below the die plate 24 with open cells 25x providing clearance for the punch pins 15 and slugs 30 as they penetrate the die 24.

Webs 25y in the window plate 25 span the grooves 28a, 28b, and 28c in the groove plate 28 and rest on the top surface of webs 70 of the groove plate 28 shown as webs 70a, 70b, 70c and 70d to transfer the punching force on the die plate 24 caused by the punch pins 15, to the groove plate 28. The webs 25y of the window plate are sufficiently narrow (approximately 0.002") as to enable their placement between the holes 24x in the die 24 so as not to interfere with the punch pins 15 and slugs 30 as they pass through the die plate 24.

Placement of the groove plate webs 70a–70d is not dependent on the location of the holes 24b in the die plate 24 because the window webs 25y provide sufficient rigidity to span any open area (i.e., 28a, 28b or 28c) in the channel plate 28. This allows for a universal groove plate design independent upon the location of punch locations in the plates above, allowing the groove plate to be re-used for any pattern, reducing cost.

For areas where punch pin density does not dictate the use of the open window area 25x such as single isolated punches, or small clusters of punches, small clearance areas can be used that are centered on the localized areas. A single punch area 71 is indicated by die location 24a with corresponding window plate clearance hole 25z. A cluster of punches 72 is shown with die locations 24e and 24f with corresponding window plate clearance holes 25s and 25t. The clearance holes form a continuous area surrounding the die holes without substantially decreasing the load transfer capability of the window plate to the groove plate 28.

With reference to the punch assembly 10 as shown in FIG. 1A for example, clearance plates 20, 21 and 22, program plate 18, head plate 17, guide plate 13 and stripper plate 12 may be formed from thin sheet material using, e.g., lasers, photoetching, mechanical drilling, electro-discharge machining, etc. Materials such as stainless steel, steel alloys, tungsten carbide and molybdenum may be used with stainless steel and molybdenum being preferred. This significantly reduces the cost of the assembly and the time needed for fabrication of the punch assembly. Likewise, die plate 24 and window plates 26 and 27 of die assembly 11 may also be made from thin sheet material. The thin sheet material may likewise be any suitable material such as stainless steel, steel alloys, tungsten carbide and molybdenum, preferably stainless steel and molybdenum. The thickness of the material is generally about 0.002 to 0.040 inch.

Figure 4:
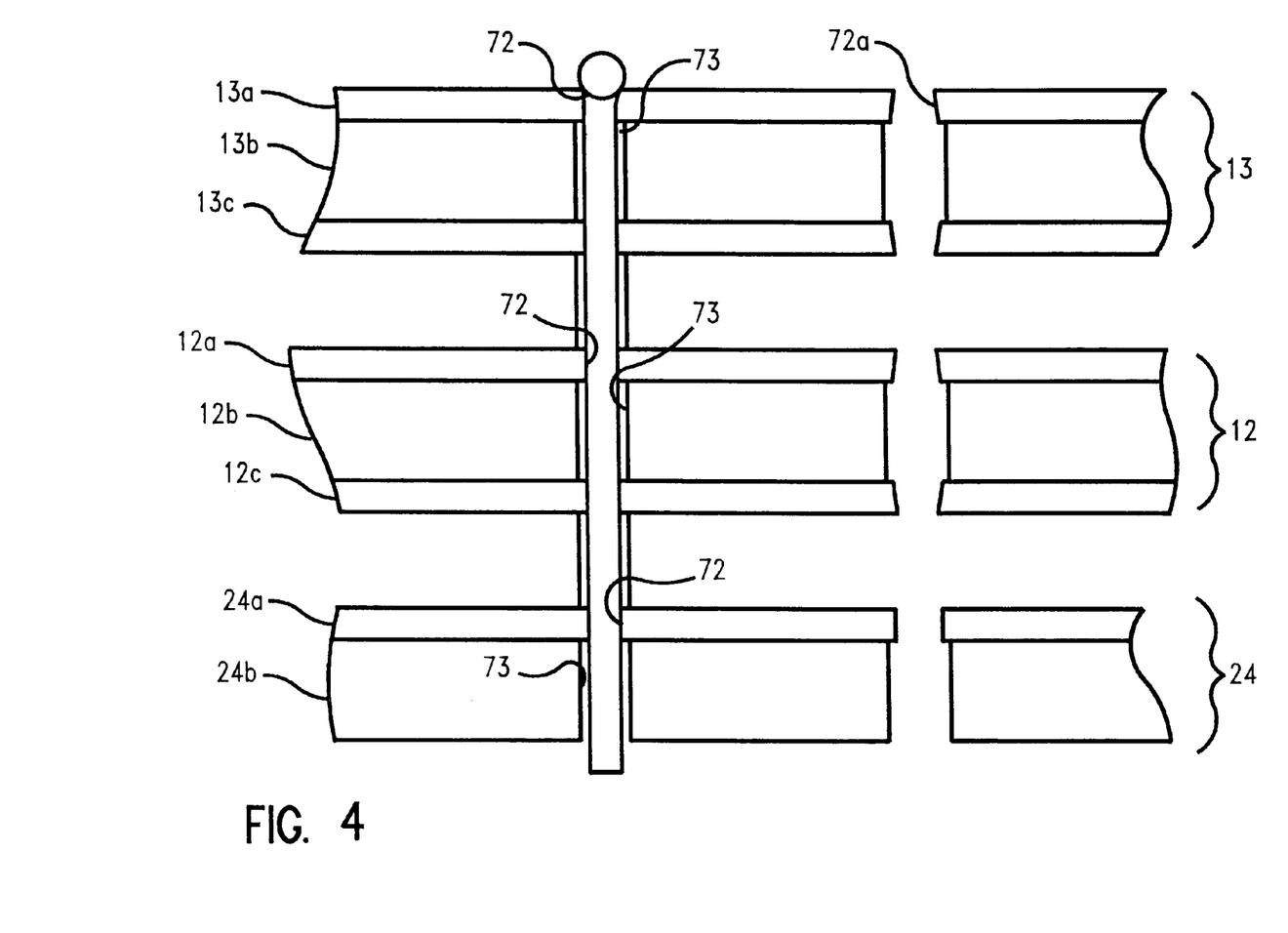
FIG. 4 shows various plates of the apparatus formed as a composite of multiple plates rather than one single plate.

In yet another aspect of the invention, stripper plate 12, guide plate 13, and die plate 24, for example, as shown in FIG. 4, can be composed of an assembly of separate plates bonded together to form a single unit. This allows the outer plates such as 13a and 13c to be formed by photoetch processes well-known in the art to produce extremely uniform, accurately placed holes 72 compared to larger holes 73 in plates 12b, 13b and 24b, while the entire assembly overcomes the limitations of a one-to-one aspect ratio limit for such etching processes.

Spacer plates 12b, 13b and 24b as shown in FIG. 4 can be fabricated using alternate and less accurate means such as laser drilling, mechanical drilling, EDM machining, as well as photoetch techniques. This allows a looser tolerance on the hole locations and diameter. The holes in plates 12b, 13b and 24b may be oversized as it serves only to separate the plates 13a and 13c, 12a and 12c and 24a, and provides the necessary clearance for the punch shank as well as providing increased rigidity to the assemblies 12, 13 and 24.

For die plate 24, plate 24b provides the necessary rigidity without the requirement of having another thin plate on the opposite side from plate 24a.

Additionally, the photoetch process allows the generation of tapered holes as shown as 72a in FIG. 4 to facilitate punch loading, proper punch to hole clearance, slug removal, etc. Bonding of the assemblies 12, 13, and 24 can be accomplished by using adhesives including epoxies, urethanes, silicon rubbers, etc. The assemblies can also be soldered, welded, riveted or otherwise fastened.

Referring now to FIGS. 2A–2E and 3A–3D, it can be seen how a gang-punch apparatus of the invention is constructed depending on the via-layout of the multilayer ceramic substrate to be built and also how the program plates are designed for use in the apparatus to make the multilayer ceramic substrate electronic component product. The layers of the multilayer ceramic are shown as 31, 32, 33 and 34. Each layer has via holes therein. Thus, layer 31 has via holes 35a, 35c, 35e, 35g and 35i. Layer 32 has via holes 35a, 35b, 35d, 35e, 35f and 35h. Layer 33 has via holes 35d and 35h. Layer 34 has via hole 35i. Based on the via holes of the MLC, gang apparatus data plate 35 shows the location of all the via holes which have to be punched to form the MLC comprising substrate layers 31–34. Using this data, a gang-punch apparatus is formed having a 3×3 array of via holes 35a–35i. Thus, there would be a total of 9 punch pins in the gang-punch apparatus with some of the punch pins being non-punch pins depending on the layer being punched.

As shown in FIGS. 3A–3D, to form program plate 31a for use in the apparatus of the invention to make MLC greensheet substrate layer 31, program plate 31a would have through hole openings 35b, 35d, 35f and 35h therein. As discussed hereinabove, these openings in program plate 31a would be non-punch pin locations which would not be punched in the greensheet since the respective punch pins 15b, 15d, 15f and 15h would be retracted into the clearance plate throughholes. Similarly, program plate 32a has through-hole openings 35c, 35g and 35i. When program plate 32a is used in the apparatus of the invention, via holes will be formed in via locations 35a, 35b, 35d, 35e, 35f and 35h. With regard to program plate 33a, via openings would only be formed in MLC layer 33 at via locations 35d and 35h. Likewise, using program plate 34a to make MLC layer 34, a via will only be punched in layer 34 at via location 35i.

It is apparent that this program feature enables this single gang-punch apparatus to manufacture up to all of the layers in a MLC ceramic substrate.

Additionally, it is possible to create a gang-punch apparatus which has incorporated therein all the possible punch locations on a closely spaced grid (i.e. 0.004 inch diameter on 0.008 inch centers). This gang-punch could therefore punch any pattern, utilizing only different program plates so long as said pattern was designed so that the punches fall on the closely spaced grid.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A gang-punch apparatus for punching selected hole patterns in thin sheet material comprises:

a lower stripper plate having a top surface and a bottom surface formed with a plurality of vertical through-holes;

a guide plate formed with a plurality of corresponding vertical through-holes and having a top surface and a bottom surface;

a pressure chamber or other expandable/contracting means between the guide plate and lower stripper plate, the plates when the chamber is not compressed being in an extended non-punching position and, when compressed, the plates being in a contracted punching position;

a plurality of elongated punch pins having an upper end and a lower end and which are axially slideably disposed in the vertical through-holes of the guide and stripper plates with the upper ends of the pins being larger so that the upper ends of the pins rest on the top surface of the guide plate, the pins being either non-punching punch pins or punching punch pins and being of a length when the guide and stripper plates are in a contracted punching position, the lower ends of the punching punch pins extend below the bottom surface of the stripper plate and through a thin sheet material on which the stripper plate rests and a die;

a program plate having a top surface and a bottom surface disposed on the top surface of the guide plate, the program plate formed with a plurality of vertical through-holes overlying non-punching punch pins;

a clearance plate disposed on the top surface of the program plate and formed with a plurality of vertical through-holes corresponding to the vertical through-holes of the guide and stripper plates, the clearance plate being of a thickness to contain in the clearance plate through-holes the non-punching punch pins when the guide and stripper plates are in a contracted punching position; and means to exert a force on the clearance plate to force the guide and stripper plates closer together thereby extending the lower ends of the punching punch pins below the bottom surface of the stripper plate and forming a hole pattern in the thin sheet material which is in contact with the surface of the stripper plate with the non-punching punch pins extending into the vertical through-holes of the clearance plate so that there is no punching of the thin sheet material at the non-punching punch pin locations.

2. The gang-punch apparatus of claim 1 wherein the expandable contracting means is a pressure chamber.

3. The gang-punch apparatus of claim 2 wherein a head plate having corresponding vertical through-holes is disposed intermediate the guide plate and the program plate to form a shoulder on the guide plate to secure the punch pins in the guide and stripper plates.

4. The gang-punch apparatus of claim 3 wherein at least one of the plates is made of a thin material fabricated by laser, photoetching, mechanical drilling or electro-discharge machining.

5. The gang punch apparatus of claim 1 wherein the guide plate, stripper plate, program plate or clearance plate is a composite of multiple plates comprising a top plate, a bottom plate and at least one inner plate with the top plate and bottom plate having uniform, accurately placed holes and the inner plate or plates having holes larger than the holes in the top plate and bottom plate.

6. The gang punch apparatus of claim 5 wherein the holes in the top plate and bottom plate are formed by laser or photoetching.

7. The gang punch apparatus of claim 6 wherein the holes in the top plate and bottom plate are tapered.

8. The gang punch apparatus of claim 1 wherein all the punch locations are incorporated on a closely spaced grid.

9. A method of gang-punching selective hole patterns in thin sheet material comprises the steps of:

provided a gang-punch pin apparatus of claim 1;

positioning the bottom surface of the stripper plate of the punch apparatus on top of a greensheet which greensheet is disposed on top of a die apparatus;

exerting a force on the clearance plate of the punch apparatus collapsing the pressure chamber and moving the punching punch pins through the greensheet and into the die apparatus with the non-punching punch pins retracting into the clearance plate; and removing the force on the clearance plate of the punch apparatus and expanding the pressure chamber to retract the punching punch pins from the die apparatus and greensheet into the guide and stripper plates.

10. The method of claim 9 wherein the gang-punch pin apparatus is the apparatus of claim 3.

11. The method of claim 9 wherein the gang-punch pin apparatus is the apparatus of claim 4.

\* \* \* \* \*